(12) United States Patent
Nawata et al.

(10) Patent No.: US 7,133,115 B2
(45) Date of Patent: Nov. 7, 2006

(54) POSITIONING DEVICE, EXPOSURE APPARATUS USING THE POSITIONING DEVICE, AND DEVICE PRODUCTION METHOD

(75) Inventors: Ryo Nawata, Tochigi (JP); Hiroshi Ito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 74 days.

(21) Appl. No.: 10/950,564

(22) Filed: Sep. 28, 2004

(65) Prior Publication Data
US 2005/0077986 A1    Apr. 14, 2005

(30) Foreign Application Priority Data
Oct. 14, 2003 (JP) .............................. 2003-353746
Oct. 15, 2003 (JP) .............................. 2003-354613

(51) Int. Cl.
*G03B 27/42* (2006.01)

(52) U.S. Cl. .................... 355/53; 355/72; 250/491.1; 310/10; 310/12; 318/649

(58) Field of Classification Search .................... None
See application file for complete search history.

(56) References Cited

U.S. PATENT DOCUMENTS 5,909,272 A    6/1999  Osanai et al. ................. 355/53
5,939,852 A    8/1999  Akutsu et al. ............... 318/640
6,008,882 A   12/1999  Ito et al. ........................ 355/53
6,028,376 A    2/2000  Osanai et al. ................. 310/12
6,359,679 B1   3/2002  Ito et al. ........................ 355/75
6,714,842 B1   3/2004  Ito .............................. 700/302
6,742,393 B1   6/2004  Ito ................................ 73/662
2004/0164253 A1* 8/2004 Ito ........................... 250/491.1

FOREIGN PATENT DOCUMENTS

JP    2001-230177    8/2001

* cited by examiner

*Primary Examiner*—D. Rutledge
(74) *Attorney, Agent, or Firm*—Fitzpatrick, Cella, Harper & Scinto

(57) ABSTRACT

A positioning device for positioning an object includes a movable member movable in X and Y directions, a top plate, disposed above the movable member, for mounting the object, at least four driving units, disposed between the top plate and the movable member, for driving the top plate with respect to the movable member in a Z direction, a position measuring unit for measuring positions of the top plate in the X and Y directions, and a controller for selecting three of the driving units based on an output from the position measuring unit. Another positioning device includes a movable member, a top plate, a driving unit for driving the top plate with respect to the movable member, a measuring unit for measuring a position of the top plate at an elastic mode node, and a controller for controlling the driving unit based on output from the measuring unit.

27 Claims, 16 Drawing Sheets

POSITIONING DEVICE, EXPOSURE APPARATUS USING THE POSITIONING DEVICE, AND DEVICE PRODUCTION METHOD

BACKGROUND OF THE INVENTION

1. Field of the Invention

The present invention relates to a positioning device, and, more particularly, to a suitable positioning device for positioning an exposure substrate, such as a mask, a reticle (original plate), a semiconductor wafer, or a glass substrate, in an exposure apparatus for producing a device such as a semiconductor device or a liquid crystal display device.

2. Description of the Related Art

A positioning device (stage device) for an exposure apparatus is disclosed in, for example, Japanese Patent Laid-Open No. 2001-230177. In this document, a wafer is placed on a top plate of a stage through a wafer chuck, and an XY slider on which the top plate of the stage is mounted is moved in an X direction and a Y direction by an X guide and a Y guide, respectively. Here, the X guide and the Y guide are driven by linear motors. An electromagnetic coupling and a plurality of linear motors are disposed between the top plate of the stage and the XY slider. The electromagnetic coupling transmits the motion of the XY slider to the top plate of the stage. The linear motors drive the top plate of the stage with respect to the XY slider. The linear motors can drive the top plate of the stage in six axial directions, that is, an X direction, a Y direction, a Z direction, a θx direction (that is, a direction around an X axis), a θy direction (that is, a direction around a Y axis), and a θz direction (that is, a direction around a Z axis). Accordingly, there are six degrees of freedom.

A measuring mirror is disposed on the top plate of the stage. A laser interferometer measures the positions of the top plate of the stage in the six axial directions. A six-degree-of-freedom positional servo system is disposed at the top plate of the stage and acts on the basis of information regarding the measured positions of the top plate in the six axial directions (six-axial-direction positional information). In other words, a command value sent to the linear motors on the back surface of the top plate of the stage is controlled by the calculations of a compensator on the basis of the six-axial direction positional information measured by the laser interferometer.

In recent years, there has been a demand for greater positioning precision and throughput in such a positioning device for an exposure apparatus. In order to meet these demands, it is necessary for the responsiveness of the positional servo system at the stage to be high and for the stage to be capable of moving at a high speed. However, there is a limit as to how high the gain of the positional servo system can be set due to oscillation of the positional servo system. There are various factors that limit servo bandwidth, one of which is vibration in an elastic mode of an object to be controlled.

SUMMARY OF THE INVENTION

It is an object of the present invention to overcome the aforementioned problems by providing the following.

According to a first aspect, the present invention provides a positioning device for positioning an object (113). The positioning device comprises a movable member (231) which is movable in an X direction and a Y direction, a top plate (111), disposed above the movable member, for mounting the object thereon, at least four driving means (151), disposed between the top plate and the movable member, for driving the top plate with respect to the movable member in a Z direction, position measuring means (311, 312) for measuring positions of the top plate in the X direction and the Y direction, and a controller (110) for selecting three of the at least four driving means on the basis of an output from the position measuring means.

In a first form, the position measuring means comprises a first mirror (121a), a second mirror (121b), and laser interferometers. The first mirror is disposed at one side of the top plate and has a reflecting surface extending in a direction perpendicular to the X direction. The second mirror is disposed at another side of the top plate and has a reflecting surface extending in a direction perpendicular to the Y direction. The first and second mirrors are irradiated with measurement light by the laser interferometers.

In a second form based on the first form, the at least four driving means comprise four driving means which are disposed at four corners of the top plate.

In a third form based on the second form, the top plate has a first area (10) and a second area (11). The first area has a triangular shape having two sides defined by the first mirror and the second mirror. The second area is the remaining area of the top plate. The controller selects three driving means that are closer to the second area when an intersection of an optical axis of one of the laser interferometers for performing a measurement in the X direction and an optical axis of another one of the laser interferometers for performing a measurement in the Y direction is situated in the first area, and selects three driving means that are closer to the first area when the intersection is situated in the second area.

By virtue of these structures, it is possible to reduce a lower harmonic elastic mode of the top plate without using a filter and to reduce a higher harmonic elastic mode by using a filter or an elastic vibration reducing mechanism.

According to a second aspect of the present invention, there is provided another positioning device for positioning an object (113). The positioning device comprises a movable member (231) which is movable in an X direction and a Y direction, a top plate (111), disposed above the movable member, for mounting the object thereon, driving means (151) for driving the top plate with respect to the movable member, measuring means (171, 311, 312, 313) for measuring a position of the top plate at a node of an elastic mode, and a controller for controlling the driving means on the basis of an output from the measuring means.

In a first form, the measuring means comprises laser interferometers (311, 312, 313) disposed in the top plate. Alternatively, in a second form, the measuring means comprises linear encoders (171) disposed on the back surface of the top plate.

By virtue of these structures, it is possible to measure the position at a node of a lower harmonic elastic mode of the top plate of the stage, so that the effects of the lower harmonic elastic mode on measurement information can be reduced. A higher harmonic elastic mode can be reduced by using a filter or an elastic vibration reducing mechanism.

The positioning devices of the present invention are suitable devices for positioning a substrate in an exposure apparatus for forming a pattern onto a substrate by illuminating the pattern. A device may be producing by using such an exposure apparatus.

Further objects, features and advantages of the present invention will become apparent from the following description of the preferred embodiments with reference to the attached drawings.

DESCRIPTION OF THE PREFERRED EMBODIMENTS

First Embodiment

Figure 1:
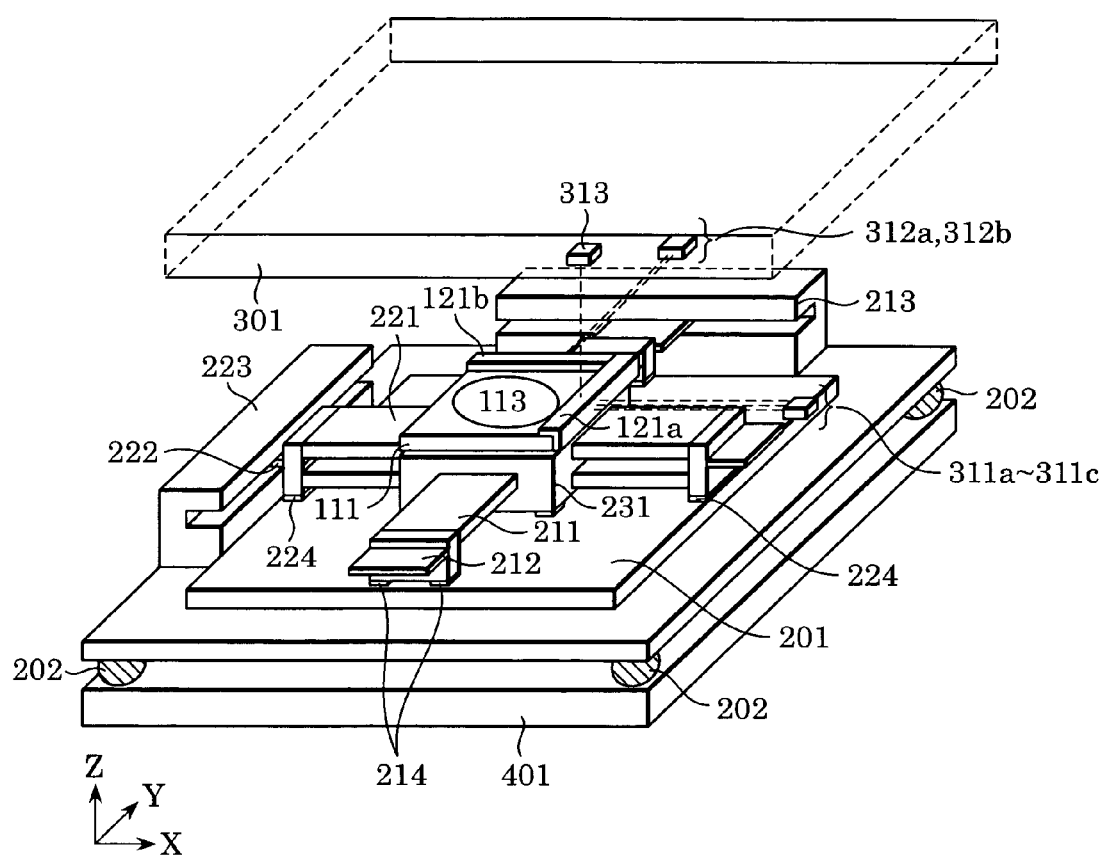
FIG. 1 is a perspective view of a wafer stage in accordance with a first embodiment of the present invention.

FIG. 1 shows a wafer stage in accordance with a first embodiment of the present invention. In FIG. 1, a wafer 113 is placed on a top plate 111 of a stage through a wafer chuck (not shown), and the top plate 111 is placed on an XY slider 231. A Y guide 221 and an X guide 211 pass through the XY slider 231 in an X direction and in a Y direction, respectively. The XY slider 231 is guided by the guides 221 and 211 and a gas bearing (not shown) without contacting them.

Air pads are disposed at the bottom surface of the XY slider 231. The XY slider 231 is supported by the gas bearing so as to be movable with respect to a wafer stage plate 201. The wafer stage plate 201 is supported at a floor 401 via air dampers 202. Similarly, air pads 214 are disposed between the X guide 211 and the wafer stage plate 201, and air pads 224 are disposed between the Y guide 221 and the wafer stage plate 201. Accordingly, the X guide 211 and the Y guide 221 are movably supported above the wafer stage plate 201. Linear motor movable portions 212 (only one of them is shown) are disposed on respective ends of the X guide 211, and linear motor movable portions 222 (only one of them is shown) are disposed on respective ends of the Y guide 221. The movable portions 212 generate a driving force between them and respective linear motor stators 213 in the X direction. The movable portions 222 generate a driving force between them and respective linear motor stators 223 in the Y direction. By virtue of such a mechanism, the X guide 211 is driven in the X direction in order to transmit a force to the XY slider 231 in the X direction, and the Y guide 221 is driven in the Y direction in order to transmit a force to the XY slider 231 in the Y direction. Therefore, the XY slider 231 is driven in the X direction and the Y direction.

An electromagnetic coupling and linear motors are disposed between the top plate 111 of the stage and the XY slider 231. The electromagnetic coupling transmits a force to the top plate 111 from the XY slider 231. The linear motors drive the top plate 111 with respect to the XY slider 231 in six axial directions. The structures of the electromagnetic coupling and the linear motors will be described later.

In FIG. 1, a measuring mirror 121a is mounted to one side of the top plate 111 in a direction perpendicular to the X direction, and a measuring mirror 121b is mounted to one side of the top plate 111 in a direction perpendicular to the Y direction. The measuring mirror 121a has a surface that is perpendicular to the X direction and a surface that is perpendicular to the Z direction. The measuring mirror 121b has a surface that is perpendicular to the Y direction and a surface that is perpendicular to the Z direction. Laser interferometers 311a to 311c are mounted to a barrel supporting member 301 serving as a position measurement reference, and are used to illuminate the measuring mirror 121a with measurement light in order to measure a displacement of the top plate 111 in the X direction, a rotational angle (θy) of the top plate 111 around a Y axis, and a rotational angle (θz) of the top plate 111 around a Z axis. Laser interferometers 312a and 312b are also mounted to the barrel supporting member 301 serving as the position measurement reference, and are used to illuminate the measuring mirror 121b with measurement light in order to measure a displacement (Y) of the top plate 111 in the Y direction and a rotational angle (θx) of the top plate 111 around an X axis. A laser interferometer 313 is used to illuminate the measuring mirror 121a with measurement light in order to measure a displacement (Z) of the top plate 111 in the Z direction. By virtue of this mechanism, information regarding the positions of the top plate 111 in six axial directions is measured. Accordingly, there are six degrees of freedom.

Figure 2:
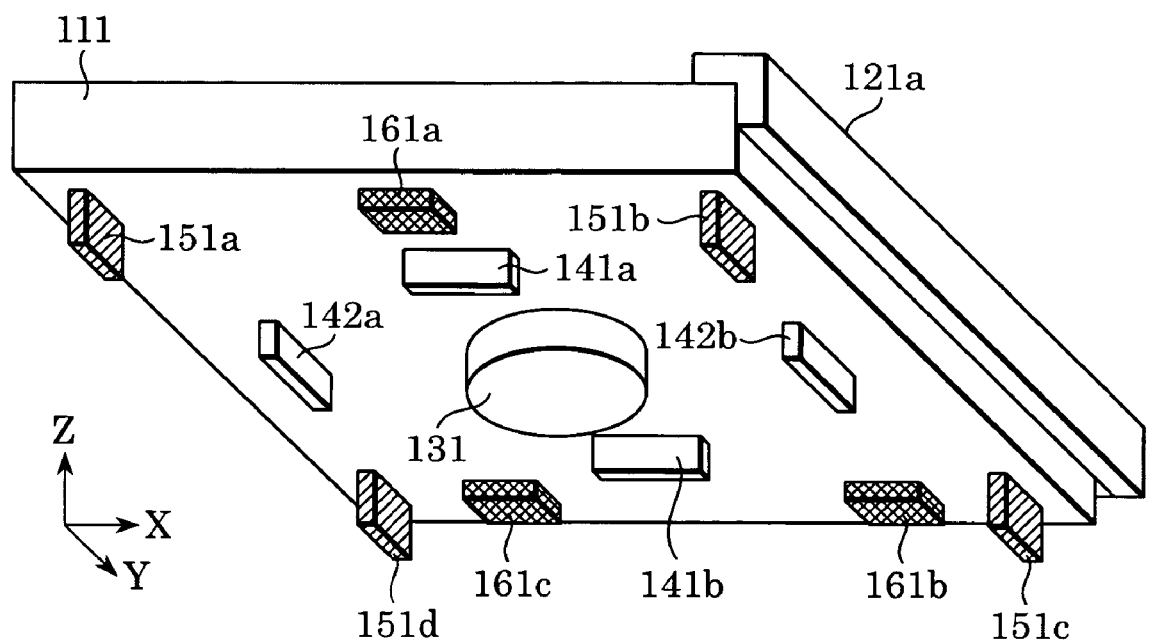
FIG. 2 shows the back side of a top plate of the stage in accordance with the first embodiment of the present invention.

FIG. 2 shows the back side of the top plate 111 of the stage. In FIG. 2, Z linear motors 151a to 151d serving as driving means are disposed at four corners of the top plate 111. The Z linear motors 151a to 151d position the top plate 111 in the Z direction, the θx direction, and the θy direction. Using measurement values of the laser interferometers 311a to 311c, 312a, 312b, and 313, force that is generated by the Z linear motors 151a to 151d is calculated by a compensator 110 serving as a controller. Here, the compensator 110 is a PID controller.

In order to control the positions of the top plate 111 in the Z direction, the θx direction, and the θy direction, it is sufficient to use three Z linear motors. In other words, since the top plate 111 is restricted excessively when four or more Z linear motors are used, it is necessary to select three Z linear motors for use. Here, the positions of the top plate 111 measured by the laser interferometers 311a to 311c and 312a and 312b are used as conditions for selecting three Z linear motors.

Hereafter, the conditions for selecting three Z linear motors for use will be given.

Figure 3:
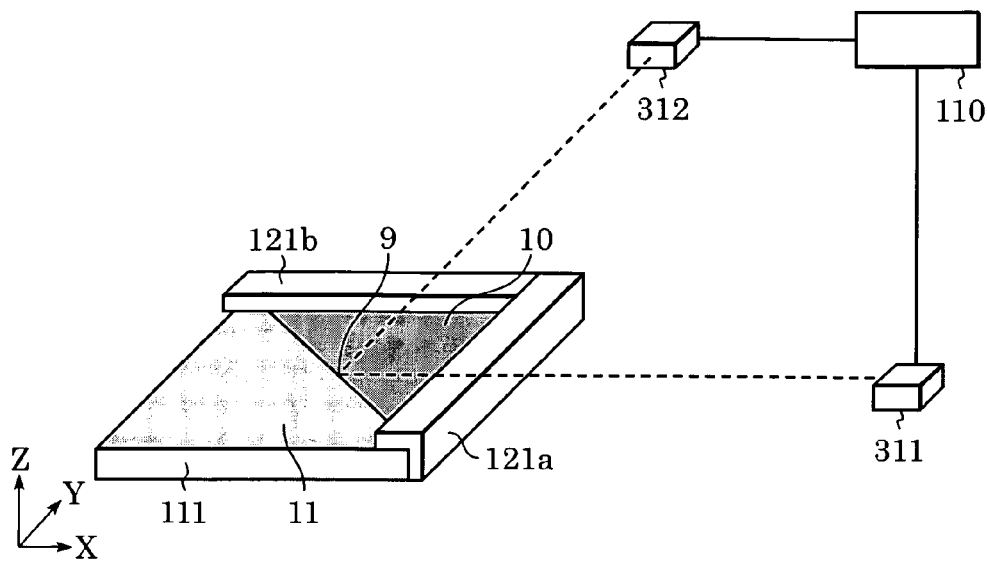
FIG. 3 illustrates the relationship between the position of the top plate of the stage and the intersection of an X position measurement axis and a Y position measurement axis.

In FIG. 3, an intersection of measurement light from either the laser interferometer 312a or the laser interferometer 312b and measurement light from any one of the laser interferometers 311a to 311c is defined as a measurement position 9. Here, for example, when an X position measurement value (or a Y position measurement value) is such that the average of two measurement values along two measurement axes is taken, an intersection of an X position measurement axis and a Y position measurement axis is defined by imaginary measurement axes passing through the midpoint of the two measurement points. Therefore, laser axes are not actually necessary. An area 10 has a triangular shape that is defined by two sides of the plate 111 to which the measuring mirrors 121a and 121b are mounted and a vertex where these two sides meet. An area 11 also has a triangular shape that is defined by two sides of the top plate 111 to which the measuring mirrors 121a and 121b are not mounted and a vertex where these two sides meet.

Figure 4:
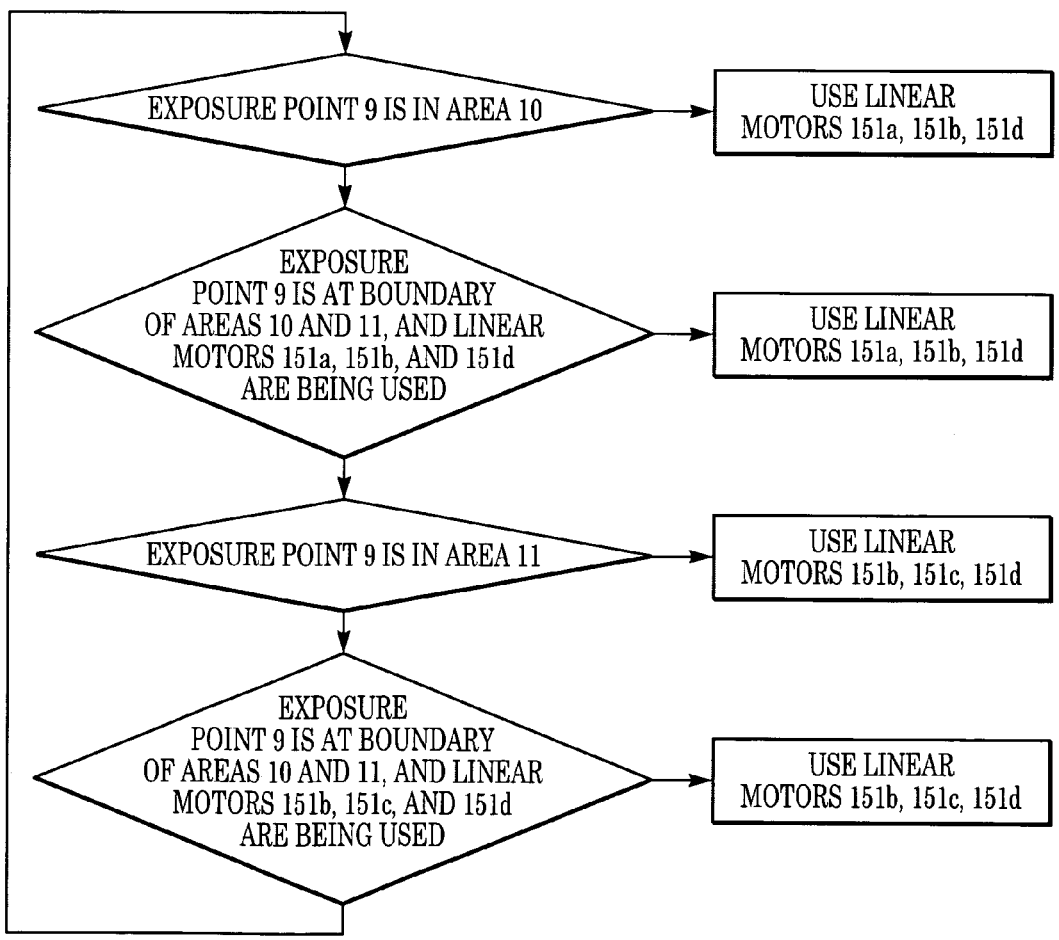
FIG. 4 is a flowchart which illustrates a method for selecting three driving means.

When the measurement position 9 is situated in the area 10, three of the four Z linear motors, excluding the Z linear motor 151c that is closest to the vertex at the two sides to which the mirrors 121a and 121b are mounted (that is, the three Z linear motors 151a, 151b, and 151d) are used to control the positions of the top plate 111 in the Z direction, the θx direction, and the θy direction. When the measurement position 9 is situated in the area 11, three of the four Z linear motors, excluding the linear motor 151a that is closest to the vertex at the two sides to which the measuring mirrors 121a and 121b are not mounted (that is, the linear motors 151b to 151d) are used to control the positions of the top plate 111 in the Z direction, the θx direction, and the θy direction. FIG. 4 is a schematic flow chart.

The top plate 111 is positioned in the X direction (X) and around the Z axis (θz) by X linear motors 141a and 141b. Command values that are sent to the linear motors 141a and 141b are calculated by the compensator 110 on the basis of measured values from the laser interferometers 311a to 311c. Similarly, the top plate 111 is positioned in the Y direction (Y) by Y linear motors 142a and 142b. Command values that are sent to the linear motors 142a and 142b are calculated by the compensator 110 on the basis of measured values from the laser interferometers 312a and 312b.

Hereafter, the advantages that are provided by the above-described structure will be mentioned.

Figure 9:
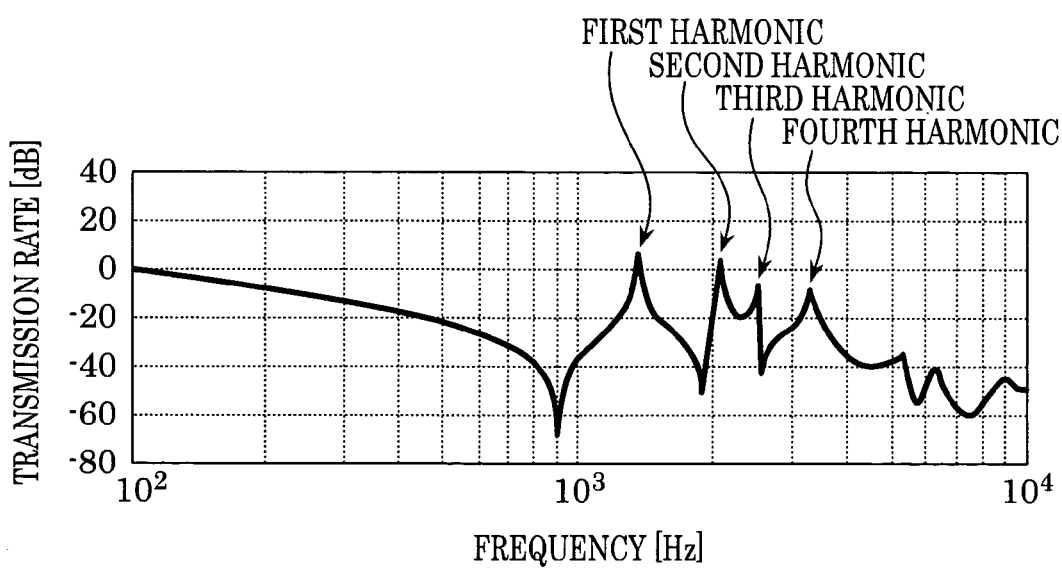
FIG. 9 is a graph showing transmission characteristics in a related wafer stage.
Figure 8:
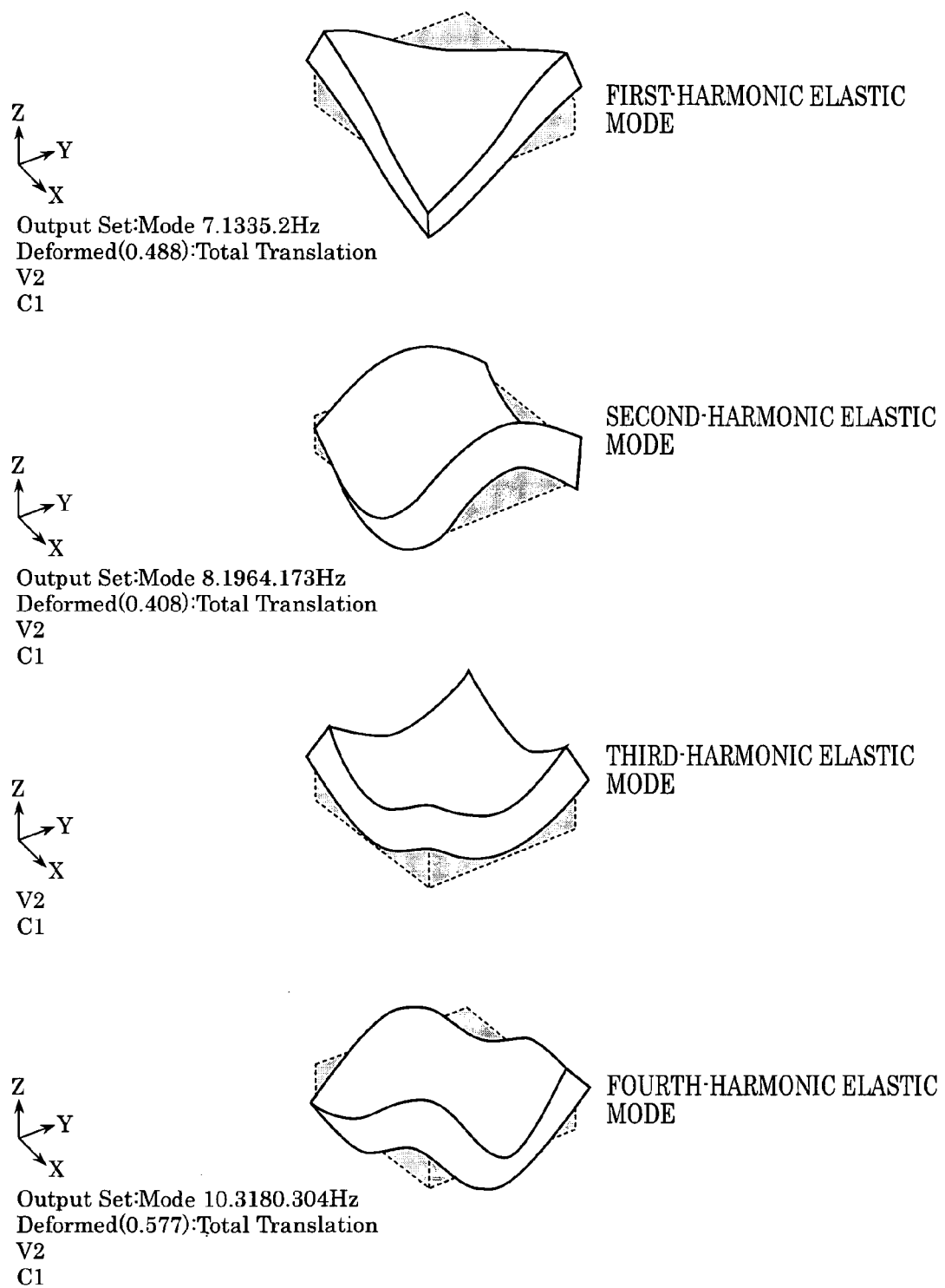
FIG. 8 illustrates elastic modes of the top plate of the stage.

Since the rigidity of a thin plate, such as the top plate 111, is small in the Z direction, vibration (that is, an elastic mode) is generated by elastic deformation, such as bending or twisting, as shown in FIG. 8. FIG. 9 shows an open loop transmission characteristic in the θy direction of the top plate 11. From FIG. 9, high peaks appear at resonant frequencies in a first harmonic elastic mode to a fourth harmonic elastic mode. In such a system, for example, as the gain of a θy-direction positional servo system is increased, the elastic modes are such that excitation occurs at the resonant frequencies, thereby reducing the precision with which the stage is positioned. If the gain of the positional servo system is rather low, the vibrations in the elastic modes only appear large. However, if the gain is further increased, the positional servo system becomes unstable and vibrates.

In order prevent such vibration, a notch filter for removing any frequency component which causes excitation in the elastic modes may be disposed at the positional servo system at the compensator. However, since the notch filter causes phase lag of the positional servo system, the positional servo system becomes unstable if it is used frequently. In particular, when the notch filter is used in a lower harmonic elastic mode, which is close to a servo bandwidth, the phase of the positional servo system considerably lags behind. Hereafter, the term "lower" means first harmonic and second harmonic, and the term "higher" means third harmonic and fourth harmonic (see FIGS. 8 and 9).

Figure 5A:
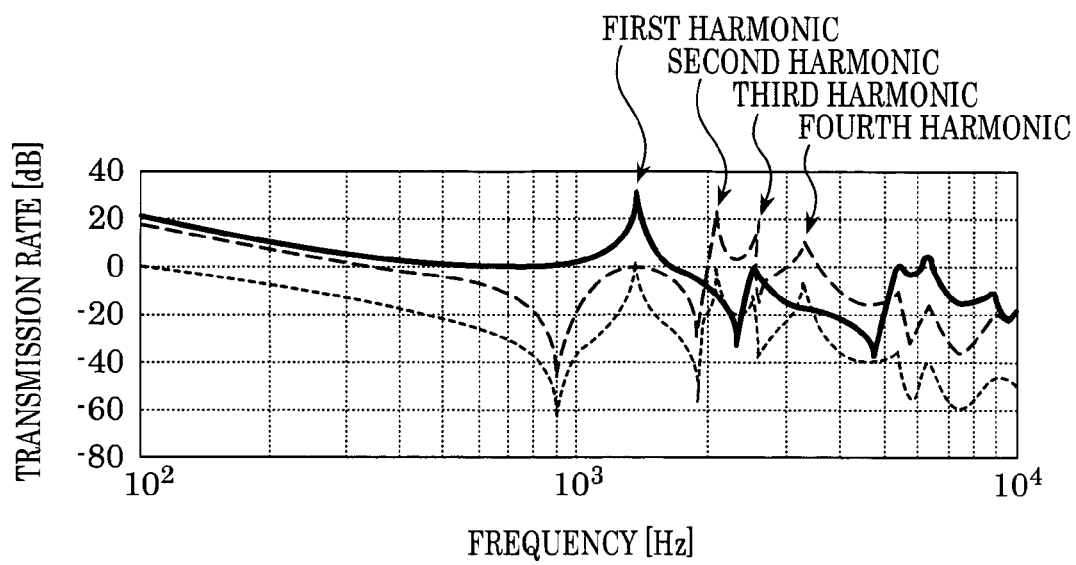
FIGS. 5A and 5B are graphs showing transmission characteristics in the first embodiment.
Figure 5B:
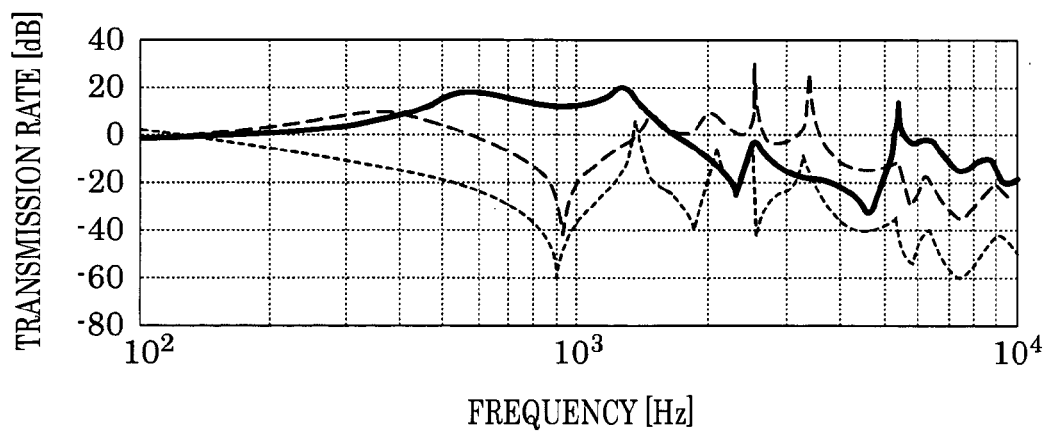

FIG. 5A shows open loop transmission characteristics of the top plate 111 around the Y axis, and FIG. 5B shows closed loop transmission characteristics of the top plate 111 around the Y axis. In FIGS. 5A and 5B, dotted curves represent the transmission characteristics when three Z linear motors are disposed at the top plate 111, dashed curves represent the transmission characteristics when the elastic modes in which excitation occurs are reduced by a notch filter, and solid curves represent the transmission characteristics when the first embodiment is carried out.

In the first embodiment, a notch filter, or the like, is not used to remove a frequency component which causes excitation in the lower harmonic elastic modes. In the dashed curve shown in FIG. 5A, the first and fourth harmonic elastic modes are reduced by a notch filter, and the servo bandwidth of the top plate 111 is 390 Hz. In the solid curve shown in FIG. 5A, the second and fourth harmonic elastic modes are reduced, and the servo bandwidth is 470 Hz. Here, the term "servo bandwidth" is determined by a crossed frequency (that is, the frequency at which an open loop gain characteristic is less than a gain equal to 0 dB), and is not a measure of the response speed defined by a closed loop frequency characteristic.

In other words, since, in the solid curve, a notch filter, or the like, is not used in the lower harmonic elastic modes, the servo bandwidth is high compared to that in the dashed curve. Therefore, response speed is high.

In the closed loop transmission characteristic that is represented by the solid curve in FIG. 5B in the first embodiment, the lower harmonic elastic modes are reduced without using a notch filter, so that excitation in the lower harmonic elastic modes is reduced without phase lag, thereby making it possible to increase the servo bandwidth.

In the first embodiment, a notch filter for removing any frequency component which causes excitation in the higher harmonic elastic modes is used in order to reduce the higher harmonic elastic modes. A low-pass filter may be used instead of the notch filter in order to provide the same advantage. The use of the notch filter in the higher harmonic elastic modes is not a problem because its use has only a small effect on the problem of phase lag.

Second Embodiment

Although, in the first embodiment, a notch filter or a low-pass filter is used to reduce the higher harmonic elastic modes, an elastic vibration reducing mechanism may be used to reduce the higher harmonic elastic modes. Hereafter, an elastic vibration reducing mechanism disposed at the back surface of a top plate 111 of a stage will be described.

Figure 6:
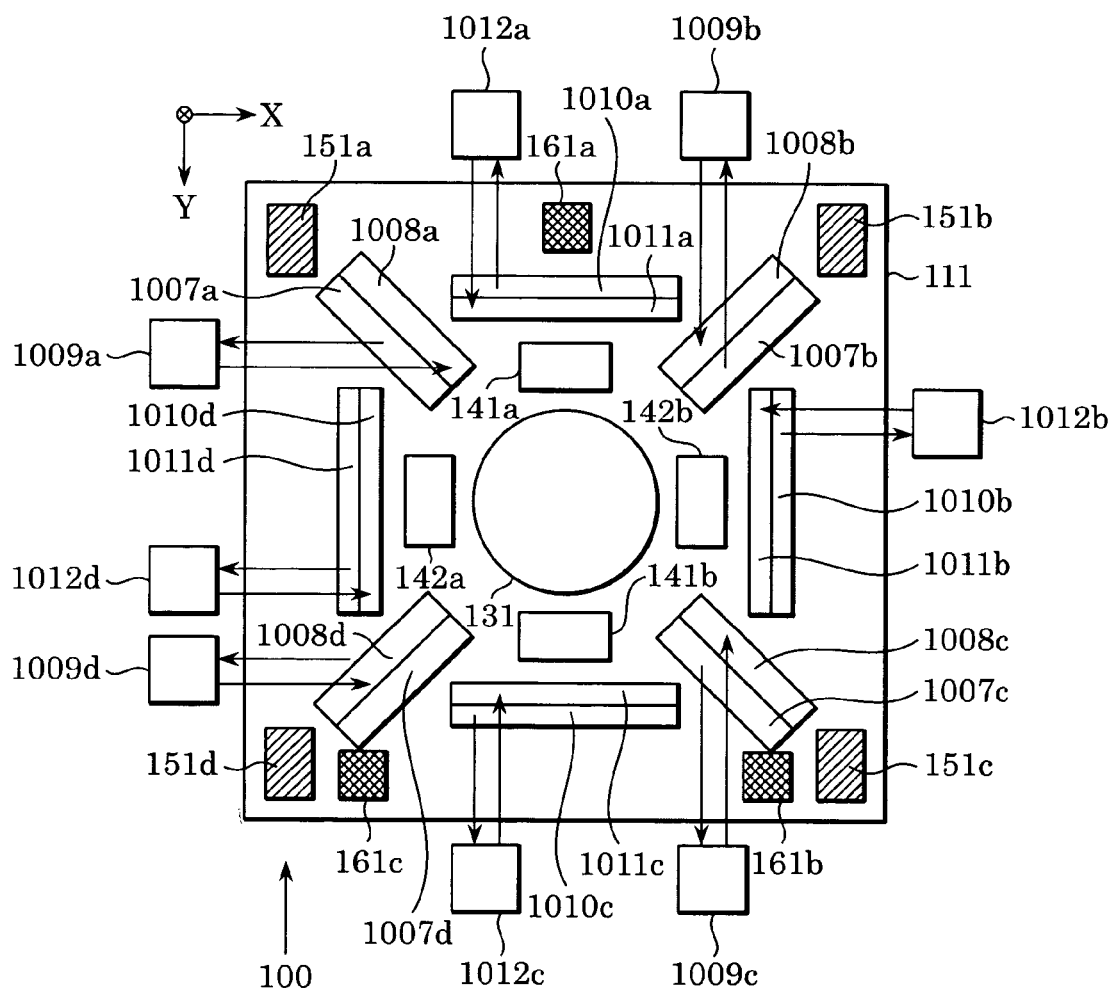
FIG. 6 shows the back side of a top plate of a stage in accordance with a second embodiment of the present invention.

FIG. 6 shows the back side of the top plate 111. Measuring units 1007a to 1007d are disposed on the back surface of the top plate 111 in order to measure elastic vibrations (elastic modes) that are generated in directions substantially parallel to line segments connecting two non-adjacent vertices of a polygon (e.g., a rectangle in FIG. 6) defined by outer sides of the top plate 111. The directions are hereafter referred to as "diagonal directions." The elastic vibrations may have a positional component, a speed component, and an acceleration component. Driving means 1008a to 1008d and compensators 1009a to 1009d are disposed on the back surface of the top plate 111. The compensators 1009a to 1009d control the driving means 1008a to 1008d, respectively. The driving means 1008a to 1008d apply forces to predetermined locations of the top plate 111 so as to reduce the elastic vibrations of the top plate 111, based on outputs from the measuring units 1007a to 1007d. More specifically, the driving means 1008a to 1008d apply forces to the top plate 111 in the diagonal directions and are disposed near or are superimposed upon the respective measuring units 1007a to 1007d. For example, piezo-electric devices may be used for the measuring units 1007a to 1007d and/or the driving means 1008a to 1008d. The compensators 1009a to 1009d control the forces applied to the predetermined locations of the top plate 111 by the driving means 1008a to 1008d so as to reduce the elastic vibrations, based on measurement information components from the respective measuring units 1007a to 1007d. The compensators 1009a to 1009d may be, for example, PID compensators or gain compensators.

Measuring units 1010a to 1010d may be further disposed on the top plate 111 in order to measure elastic vibrations that are generated in directions substantially parallel to straight lines of the rectangle defined by the outer sides of the top plate 111. These directions are hereafter referred to as side directions. Here, driving means 1101a to 1011d for applying forces in the side directions (linear portions) of the top plate 111 are disposed close to or are superimposed upon the measuring units 1010a to 1010d. Compensators 1012a to 1012d control the forces applied by the driving means 1011a to 1011d so as to reduce the elastic vibration, based on measurement information from the measuring units 1010a to 1101d. The compensators 1012a to 1012d may be, for example, PID compensators or gain compensators.

Compared to the notch filter, such an elastic vibration reducing mechanism can damp the elastic modes even if excitation occurs in the elastic modes of the top plate due to a disturbance (such as floor vibration transmitted through, for example, a flexible cable, a wiring, or a pipe).

Although, in the embodiment, the elastic vibration reducing mechanism has a structure which restricts elastic vibration both in the diagonal directions and in the side directions (see FIG. 6), the present invention is not limited thereto. For example, the elastic vibration reducing mechanism may have a structure which restricts elastic vibration in either the diagonal directions or the side directions.

Figure 7:
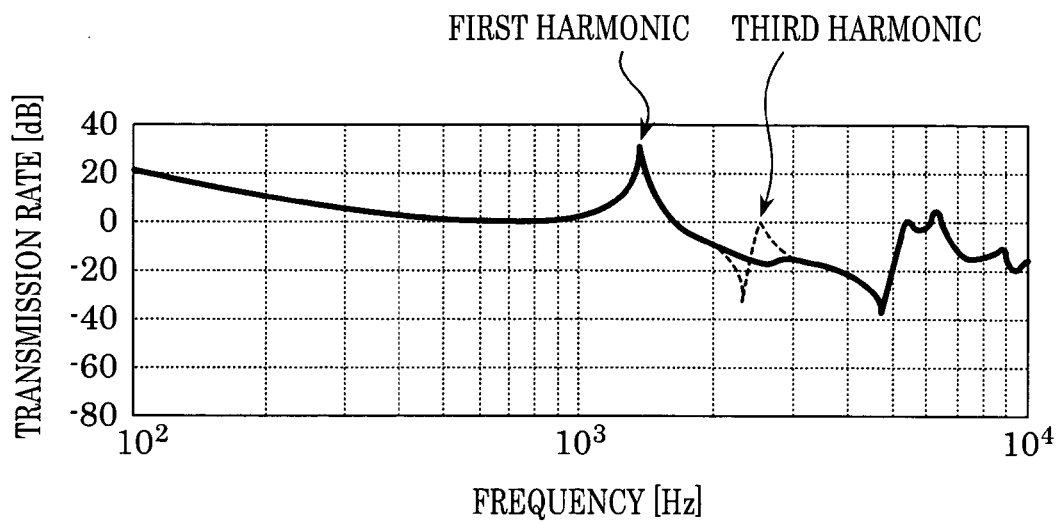
FIG. 7 is a graph showing transmission characteristics in the second embodiment.

A solid curve in FIG. 7 represents an open loop transmission characteristic around a Y axis of the top plate 111 when the elastic vibration that is generated in the side directions is reduced by using the measuring units 1011a to 1101d, the driving means 1011a to 1011d, and the compensators 1012a to 1012d. A dotted curve in FIG. 7 represents an open loop transmission characteristic when the elastic vibration that is generated in the side directions is not controlled. It can be seen that the third harmonic elastic vibration is reduced by using the elastic vibration reducing mechanism.

Third Embodiment

Figure 10:
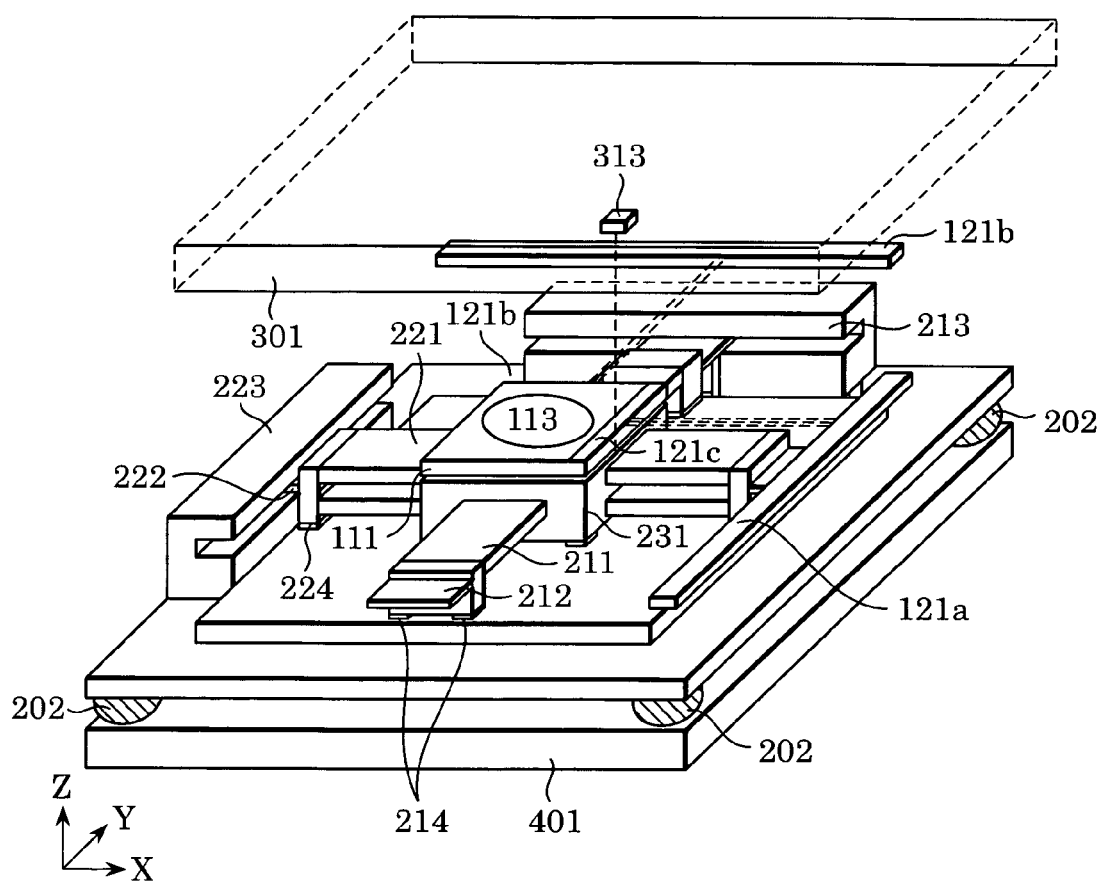
FIG. 10 is a perspective view of a wafer stage in accordance with a third embodiment of the present invention.
Figure 11:
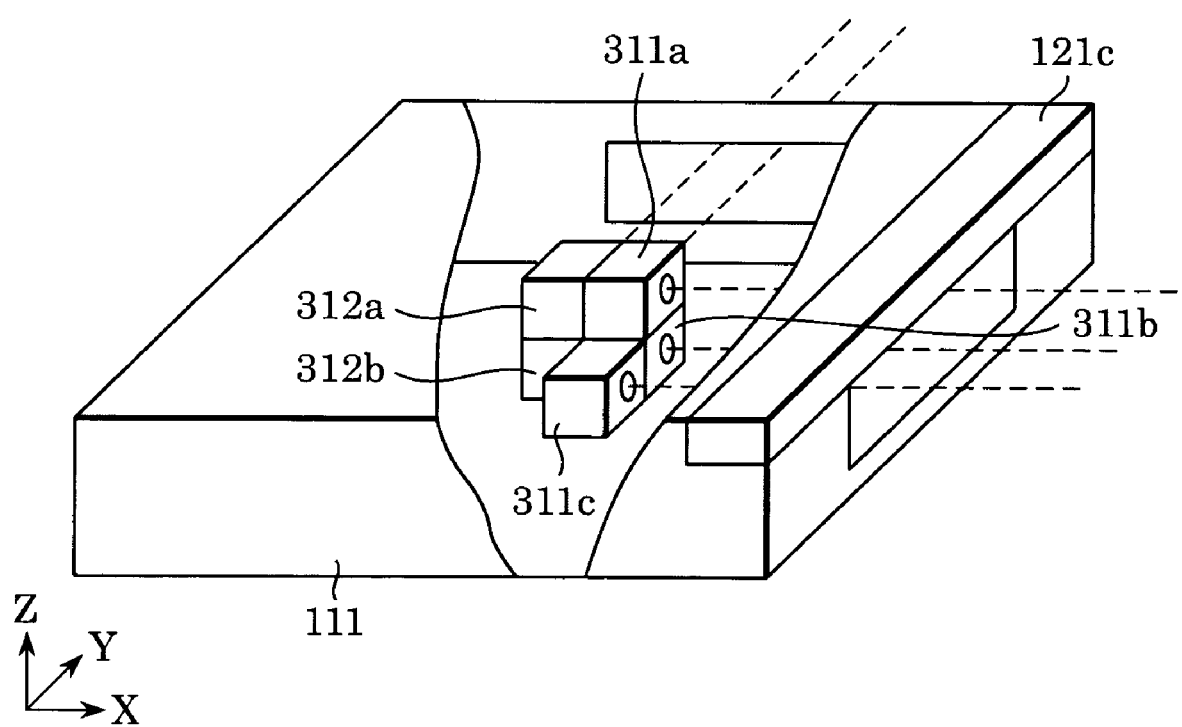
FIG. 11 shows the inside of a top plate of the stage in accordance with the third embodiment of the present invention.

FIG. 10 is a schematic view of a wafer stage in accordance with a third embodiment of the present invention. FIG. 11 shows the internal portion of a top plate of a stage. Parts that are similar to those in the first embodiment are given the same reference numerals, and will not described in detail below.

In the first and second embodiments, the laser interferometers are disposed at the barrel supporting member, whereas, in the third embodiment, laser interferometers 311a to 311c, 312a, and 312b are mounted in a top plate 111. The laser interferometers 311a to 311c are used to illuminate a long measuring mirror 121a with measurement light in order to measure a displacement of the top plate 111 in an X axis direction, a rotational angle (θy) of the top plate 111 around a Y axis, and a rotational angle (θz) of the top plate 111 around a Z axis. The measuring mirror 121a is mounted to a barrel supporting member 301 serving as a position measurement reference so that one surface is orthogonal to the X axis and the other surface is orthogonal to the Z axis. The laser interferometers 312a and 312b are used to illuminate a long measuring mirror 121b with measurement light in order to measure a displacement of the top plate 111 in a Y axis direction and a rotational angle (θx) of the top plate 111 around the X axis. The measuring mirror 121b is mounted to the barrel supporting member 301 so that one surface is perpendicular to the Y axis and the other surface is perpendicular to the Z axis. A laser interferometer 313 is mounted to the barrel supporting member 301, and is used to illuminate a measuring mirror 121c with measurement light in order to measure a displacement of the top plate 111 in the Z direction. By this method, six displacements (six degrees of freedom) of the top plate 111 from the positional reference are measured.

Here, although it is possible to measure a position of the top plate near an elastic mode node (central portion of the top plate from FIG. 8) by the laser interferometers in the top plate, a laser interferometer may be separately provided in order to measure a position other than that at a node.

Although, in the first and second embodiments, four Z linear motors are provided, three Z linear motors are provided in the third embodiment.

Hereafter, the advantages of the third embodiment will be mentioned.

Figure 12A:
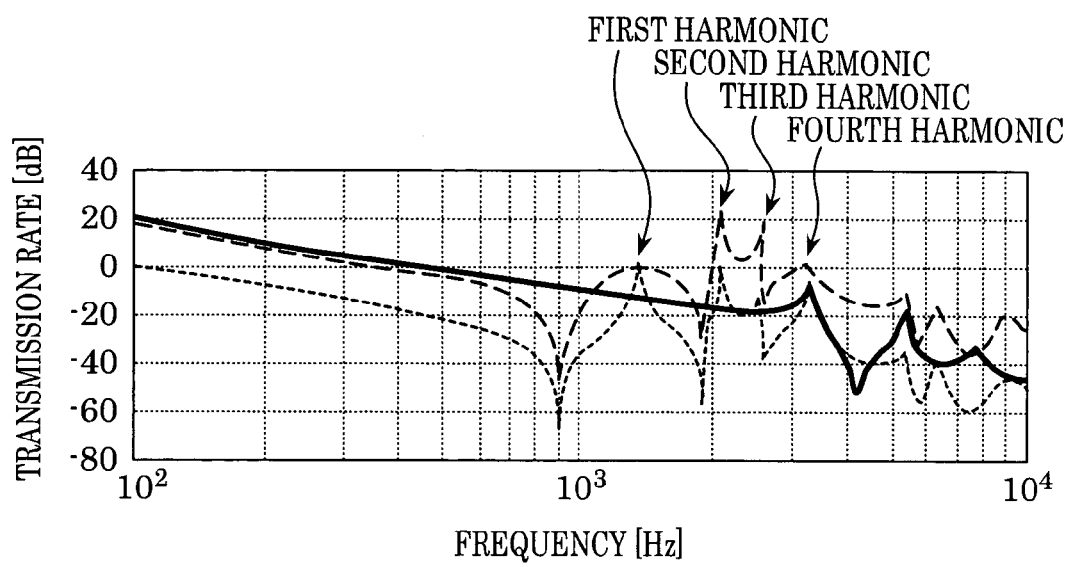
FIGS. 12A and 12B are graphs showing transmission characteristics in accordance with the third embodiment of the present invention.
Figure 12B:
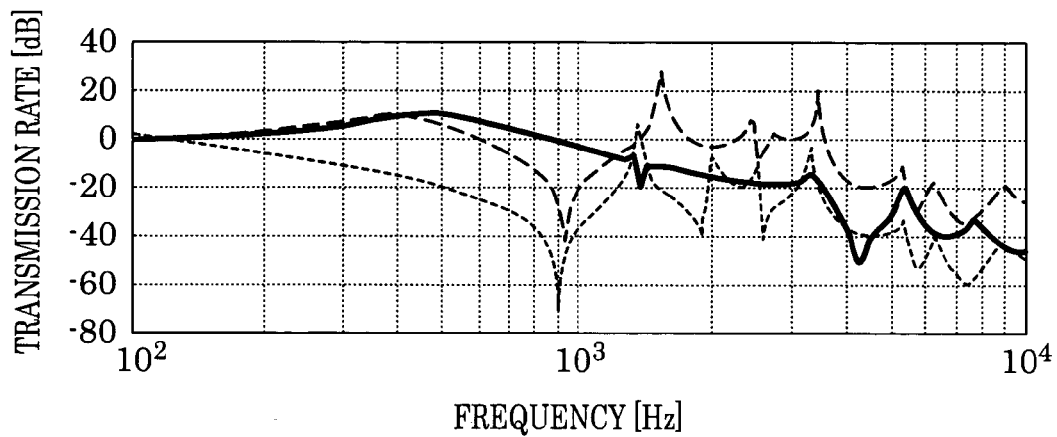

FIG. 12A is a graph showing open loop transmission characteristics around the Y axis of the top plate 111, and FIG. 12B is a graph showing closed loop transmission characteristics around the Y axis of the top plate 111. Dotted curves and dashed curves in FIGS. 12A and 12B and the dotted curves and dashed curves in FIGS. 5A and 5B represent transmission characteristics under the same conditions. Solid curves in FIGS. 12A and 12B represent transmission characteristics when the third embodiment is carried out. When the solid curves and the respective dotted curves in FIGS. 12A and 12B are compared, the solid curves do not show the occurrence of excitation in the lower harmonic elastic modes. Accordingly, since a notch filter is not required in the lower harmonic elastic modes in the third embodiment, the servo bandwidth can be increased in correspondence with the lack of phase lag of a controlling system. In FIG. 12A, the servo bandwidth of the top plate 111 in the third embodiment is 450 Hz.

In the third embodiment, however, a notch filter for removing a frequency component which causes excitation in the higher harmonic elastic modes is used in order to reduce the higher harmonic elastic modes. A low-pass filter may be used instead of the notch filter to provide the same advantage. The use of the notch filter in the higher harmonic elastic modes is not a problem because its use has only a small effect on phase lag.

Accordingly, in the third embodiment, the positions of the top plate at the nodes of the lower harmonic elastic modes can be measured, so that it is possible to reduce the effects of the lower harmonic elastic modes on the measurement information. In other words, it is possible to carry out servo control with a high control bandwidth.

Fourth Embodiment

Figure 13:
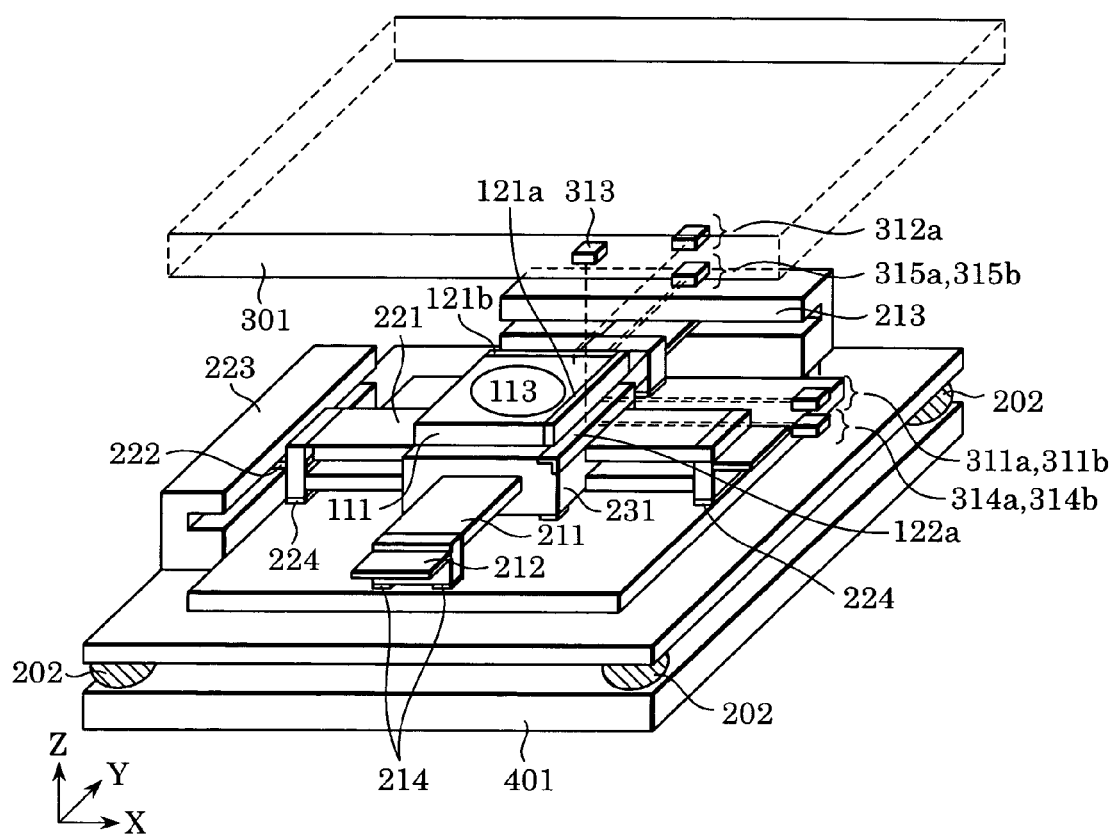
FIG. 13 shows a wafer stage in accordance with a fourth embodiment of the present invention.
Figure 14:
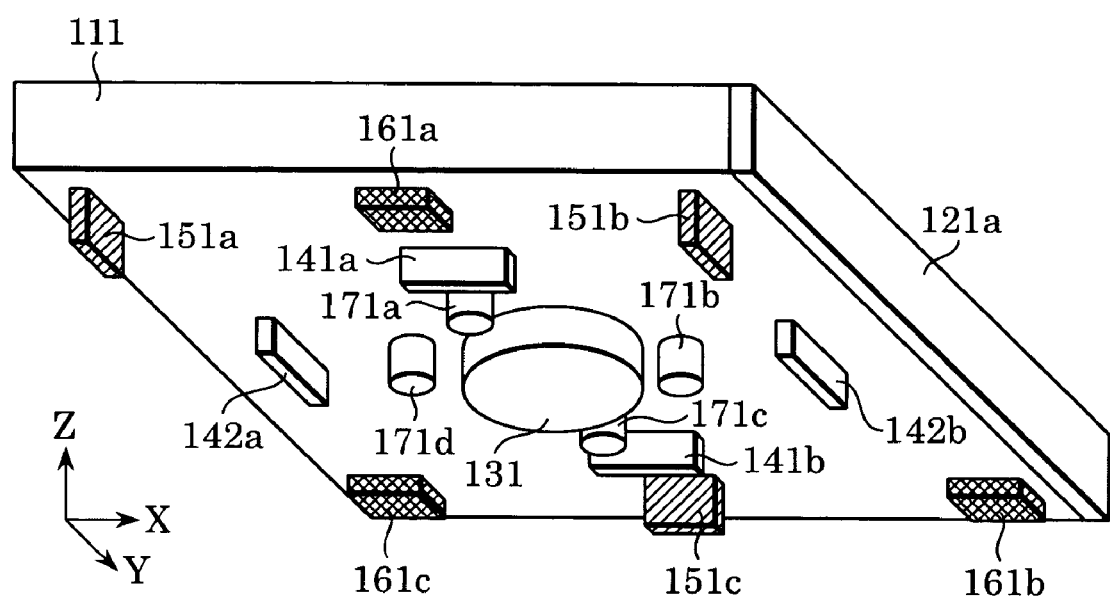
FIG. 14 shows the back side of a top plate of the stage in accordance with the fourth embodiment of the present invention.

FIG. 13 is a schematic perspective view of a wafer stage in accordance with a fourth embodiment of the present invention. FIG. 14 shows the back side of a top plate 111 of a stage. Parts that are similar to those in the first embodiment are given the same reference numerals, and will not be described in detail below.

In FIG. 14, linear encoders 171a to 171d are mounted near the center of the back surface of the top plate 111, and measure a displacement of the top plate 111 in a Z direction, a rotational angle (θx) of the top plate 111 around an X axis, and a rotational angle (θy) of the top plate 111 around a Y axis with respect to an XY slider 231. The central portions of the top plate 111 correspond to the nodes of the first-harmonic and second-harmonic elastic modes. Therefore, mounting the linear encoders 171a to 171d to the central portions of the top plate 111 makes it possible to prevent the first-harmonic and second-harmonic elastic modes from influencing measurement values of the linear encoders 171a to 171d. Here, although four linear encoders are used, three linear encoders may be used.

The linear encoders 171a to 171d are mounted at the positions near the center of the back surface of the top plate 111. These positions correspond to the positions of the top plate 111 at the nodes of the first-harmonic and second-harmonic elastic modes from FIG. 8.

Four Z linear motors are provided in the first and second embodiments, whereas three Z linear motors are provided in the fourth embodiment.

Laser interferometers 314a and 314b are mounted to a barrel supporting member 301 serving as a position measurement reference, and are used to illuminate a measuring mirror 122a with measurement light in order to measure a rotational angle (θy1) of the XY slider 231 around a Y axis thereof with respect to the position measurement reference. Laser interferometers 315a and 315b are mounted to the barrel supporting member 301, and are used to illuminate a measuring mirror 122b (not shown) with measurement light in order to measure a rotational angle (θx1) of the XY slider 231 around an X axis with respect to the position measurement reference. A laser interferometer 313 is mounted to the barrel supporting member 301, and is used to illuminate a measuring mirror 122a with measurement light in order to measure a displacement (Z1) of the XY slider 231 in the Z direction. A displacement (Z) of the top plate 111 in the Z direction, a rotational angle (θx) of the top plate 111 around an X axis, and a rotational angle (θy) of the top plate 111 around a Y axis with respect to the position measurement reference can be determined from measurements of the XY slider 231 with respect to the position measurement reference and measurements of the top plate 111 with respect to the XY slider 231. Measurements of the XY slider 231 with respect to the position measurement reference are: the displacement of the XY slider 231 in the Z direction, the rotational angle (θx1), and the rotational angle (θy1). Measurements of the top plate 111 with respect to the XY slider 231 are: a displacement (Z2) of the top plate 111 in the Z direction, a rotational angle (θx2) of the top plate 111 around the X axis, and a rotational angle (θy2) of the top plate 111 around the Y axis with respect to the XY slider 231.

Laser interferometers 311a and 311b are mounted to the barrel supporting member 301, and are used to illuminate a measuring mirror 121a with measurement light in order to measure a displacement (X) of the top plate 111 in an X axis direction and a rotational angle (θz) of the top plate 111 around a Z axis with respect to the position measurement reference. A laser interferometer 312a is mounted to the barrel supporting member 301, and is used to illuminate a measuring mirror 121b with measurement light in order to measure a displacement (Y) of the top plate 111 in a Y axis direction with respect to the position measurement reference. By this method, six displacements (six degrees of freedom) of the top plate 111 from the position reference are measured.

Hereafter, the advantages of the fourth embodiment will be mentioned.

Figure 15A:
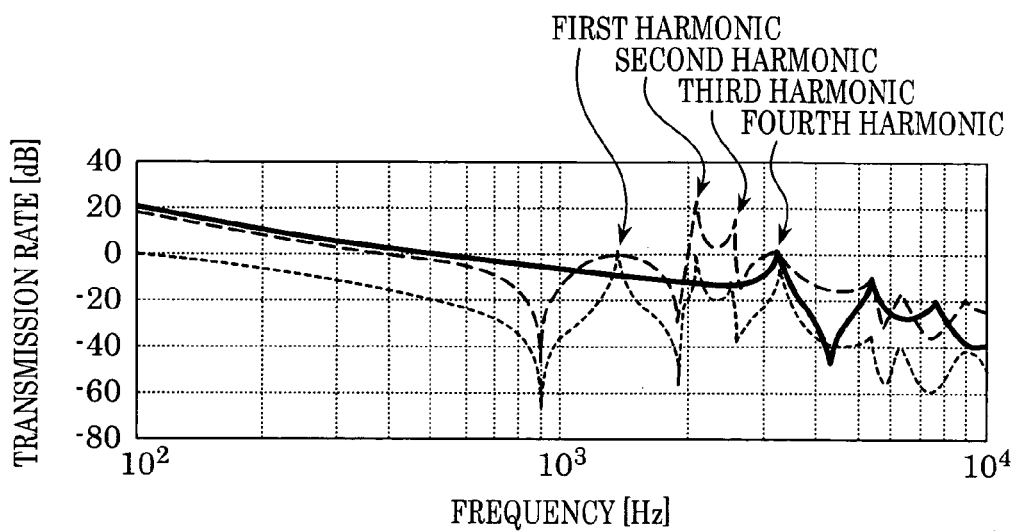
FIGS. 15A and 15B are graphs showing transmission characteristics in accordance with the fourth embodiment of the present invention.
Figure 15B:
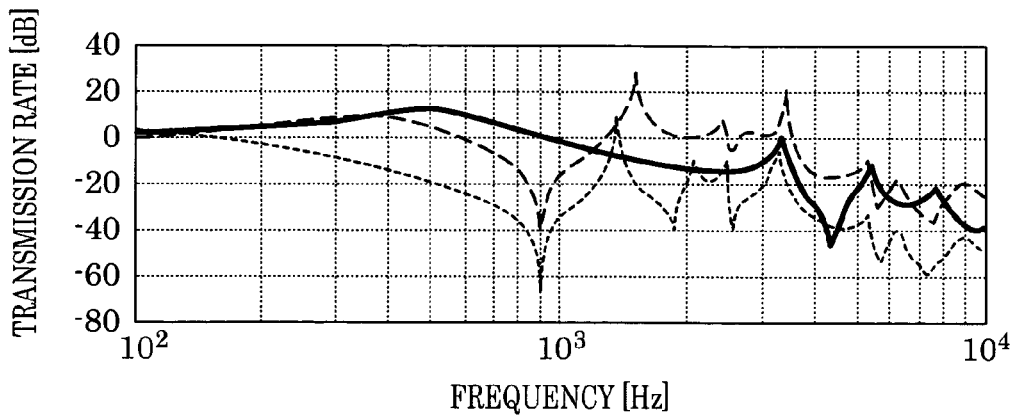

FIG. 15A is a graph showing open loop transmission characteristics of the top plate 111 around the Y axis, and FIG. 15B is a graph showing closed loop transmission characteristics of the top plate 111 around the Y axis. Dotted curves and dashed curves in FIGS. 15A and 15B and the dotted curves and dashed curves in FIGS. 5A and 5B represent transmission characteristics under the same conditions. Solid curves in FIGS. 15A and 15B represent transmission characteristics when the stage device in the fourth embodiment is used. The dashed curve in FIG. 15A shows that the first-harmonic and fourth-harmonic elastic modes are reduced by using a notch filter. Here, a servo bandwidth of the top plate 111 is 380 Hz. When the solid curves and the respective dotted curves in FIGS. 15A and 15B are compared, the solid curves do not show the occurrence of excitation in the first-harmonic and second-harmonic elastic modes. Accordingly, since the notch filter is not used in each of the first-harmonic and second-harmonic elastic modes in the fourth embodiment, the servo bandwidth can be increased in correspondence with the lack of phase lag of a controlling system compared to that in the related art. In FIG. 15A, the servo bandwidth of the top plate 111 is 460 Hz.

In the fourth embodiment, a notch filter for removing any frequency component which causes excitation in the higher harmonic elastic modes is used in order to reduce the higher harmonic elastic modes. A low-pass filter may be used instead of the notch filter in order to provide the same advantage. The use of the notch filter in the higher harmonic elastic modes is not a problem because its use has only a small effect on the problem of phase lag.

Accordingly, in the fourth embodiment, the positions of the top plate at the nodes of the lower harmonic elastic modes can be measured, so that it is possible to reduce the effects of the lower harmonic elastic modes on the measurement information. In other words, it is possible to carry out servo control with a high control bandwidth.

Fifth Embodiment

Although, in the third and fourth embodiments, a notch filter or a low-pass filter is used to reduce the higher harmonic elastic modes, an elastic vibration reducing mechanism may be used to reduce the higher harmonic elastic modes. An elastic vibration reducing mechanism disposed at the back surface of a top plate 111 of a stage in accordance with a fifth embodiment of the present invention will be described.

Figure 16:
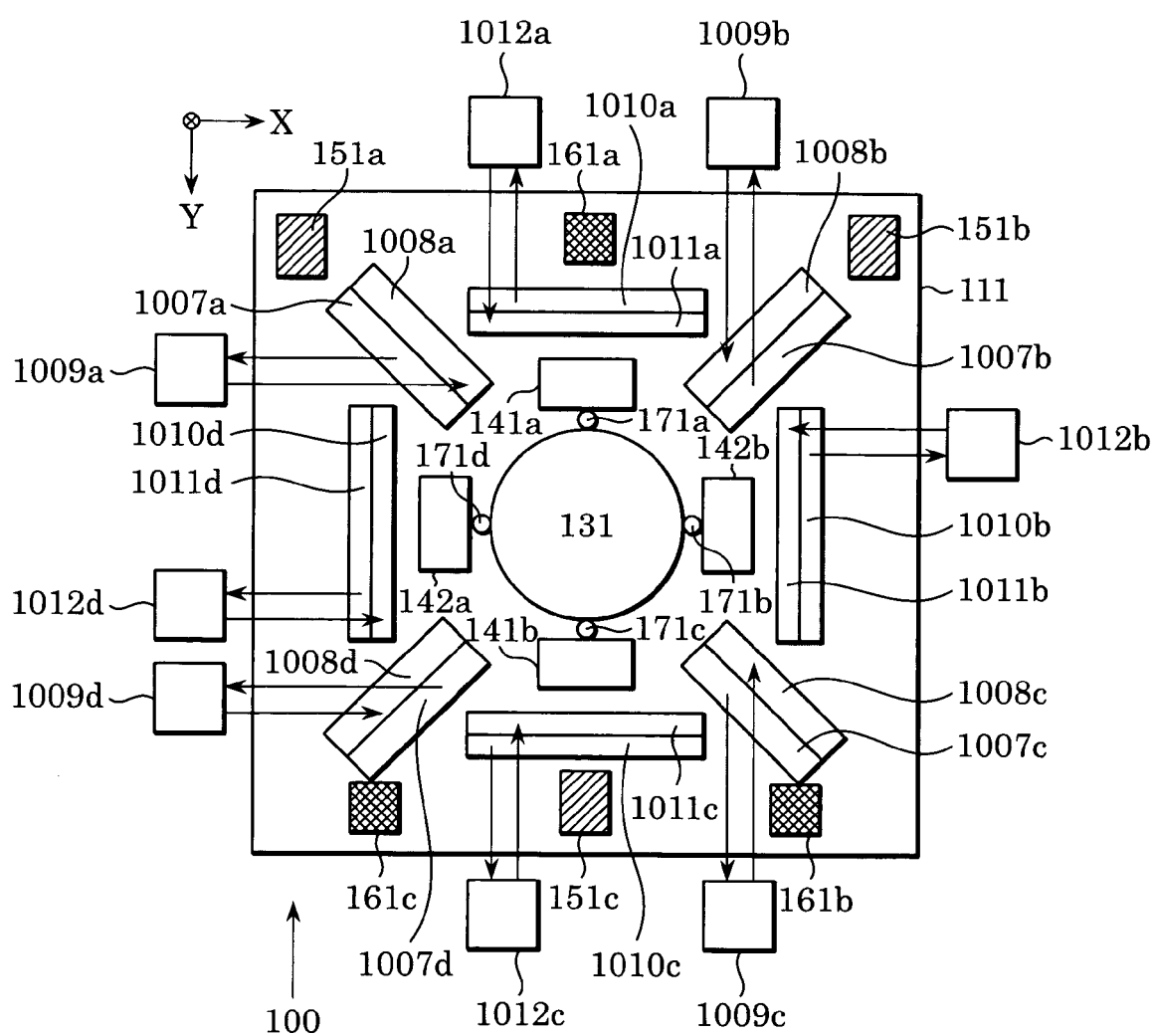
FIG. 16 shows the back side of a top plate of a stage in accordance with a fifth embodiment of the present invention.

FIG. 16 shows the back side of the top plate 111 in accordance with the fifth embodiment. Measuring means 1007a to 1007d are disposed on the back surface of the top plate 111 in order to measure elastic vibrations that are generated in directions substantially parallel to line segments connecting two non-adjacent vertices of a polygon (e.g., a rectangle as shown in FIG. 11), defined by outer sides of the top plate 111. The directions are hereafter referred to as "diagonal directions." The elastic vibrations may have a positional component, a speed component, and an acceleration component. Driving means 1008a to 1008d and compensators 1009a to 1009d are disposed on the back surface of the top plate 111. The compensators 1009a to 1009d control the driving means 1008a to 1008d, respectively. The driving means 1008a to 1008d apply forces to predetermined locations of the top plate 111 so as to reduce elastic vibrations of the top plate 111, based on outputs from the measuring means 1007a to 1007d. More specifically, the driving means 1008a to 1008d apply forces to the top plate 111 in the diagonal directions and are disposed near or are superimposed upon the respective measuring means 1007a to 1007d. For example, piezo-electric devices may be used for the measuring means 1007a to 1007d and/or the driving means 1008a to 1008d. The compensators 1009a to 1009d control the forces applied to the predetermined locations of the top plate 111 by the driving means 1008a to 1008d so as to reduce the elastic vibrations, based on measurement information components from the respective measuring means 1007a to 1007d. The compensators 1009a to 1009d may be, for example, PID compensators or gain compensators.

Measuring units 1010a to 1010d may be further disposed on the top plate 111 in order to measure elastic vibrations that are generated in directions substantially parallel to straight lines of the polygon defined by the outer sides of the top plate 111. These directions are hereafter referred to as side directions. Here, driving means 1011a to 1011d for applying forces in the side directions (linear portions) of the top plate 111 are disposed close to or are superimposed upon the measuring means 1010a to 1010d. Compensators 1012a to 1012d control the forces applied by the driving means 1101a to 1011d so as to reduce the elastic vibrations, based on measurement information from the measuring means 1010a to 1101d. The compensators 1012a to 1012d may be, for example, PID compensators or gain compensators.

Although, in this embodiment, the elastic vibration reducing mechanism has a structure which restricts elastic vibration both in the diagonal directions and in the side directions (see FIG. 16), the present invention is not limited thereto. For example, the elastic vibration reducing mechanism may have a structure which restricts elastic vibration in either the diagonal directions or the side directions.

Exposure Apparatus

Figure 17:
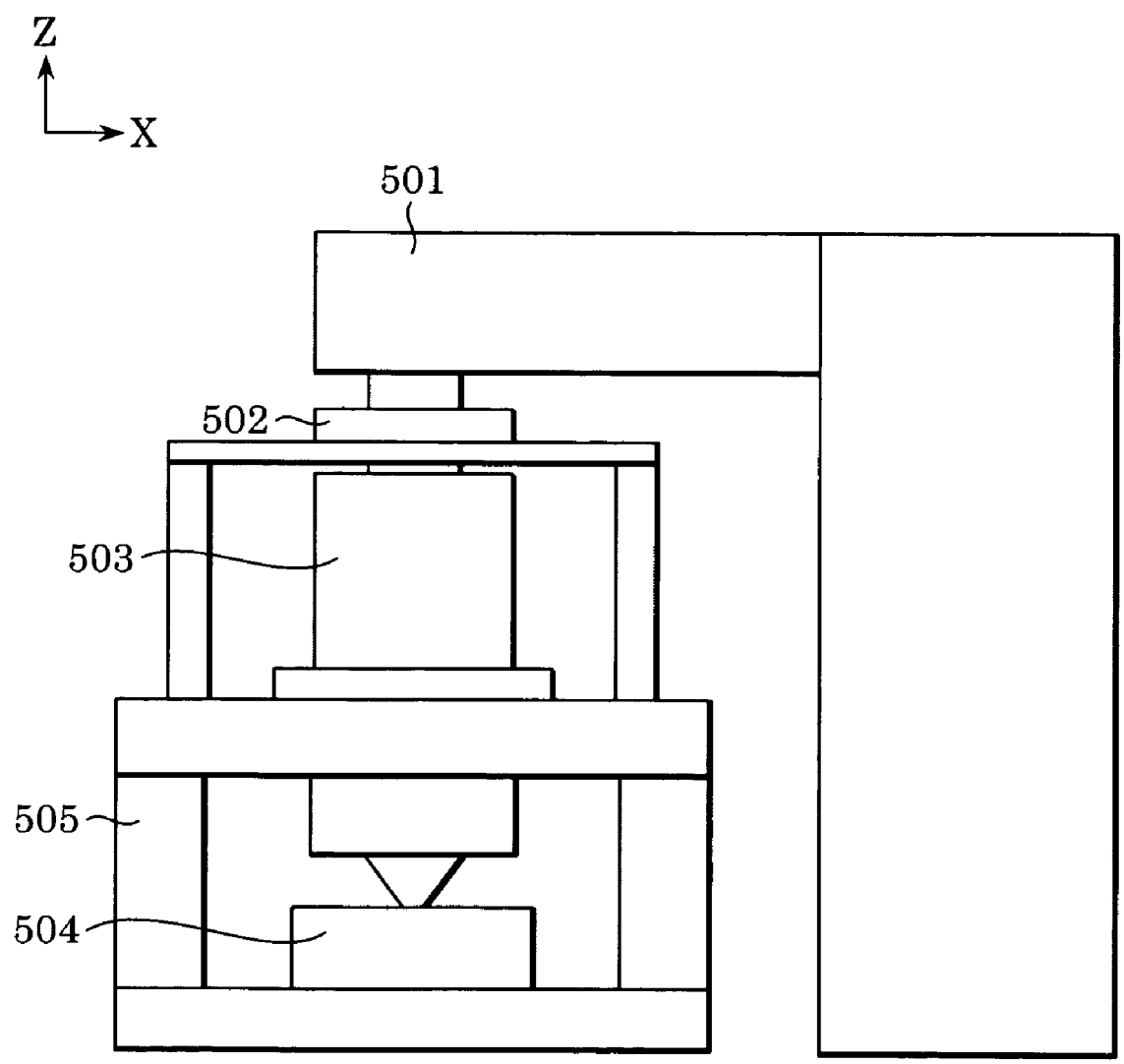
FIG. 17 shows an exposure apparatus.

FIG. 17 shows an example in which the above-described positioning device is used in a semiconductor device producing apparatus (e.g., an exposure apparatus).

The exposure apparatus is used in producing devices with fine patterns, such as semiconductor devices (semiconductor integrated circuits, for example), micromachines, and thin-film magnetic heads. When a semiconductor wafer (serving as a substrate) is illuminated with exposure light serving as exposure energy from an illuminating unit 501 through a reticle (original plate) and through a projection lens 503 serving as a projection system, a predetermined pattern is formed on the substrate that is placed on a wafer stage 504. The term "exposure light" is used as a general term to include visible light, ultraviolet light, extreme ultraviolet (EUV) light, X-rays, electron rays, and charged particles. The term "projection lens" is used as a general term to include a refractive lens, a reflective lens, a catadioptric lens, and a charged particle lens. Reference numeral 505 denotes a barrel supporting member for supporting the projection lens. The exposure apparatus is required to carry out exposure in a vacuum with decreasing wavelength of the exposure light.

The wafer (object) is held on the wafer stage 504 by a chuck. The illuminating unit 501 transfers the pattern on the reticle disposed on a reticle stage 502 onto areas on the wafer by the step-and-repeat or step-and-scan method. The positioning devices of the first to fifth embodiments are used as the wafer stage 504 or the reticle stage 502.

Device Production Method

Figure 18:
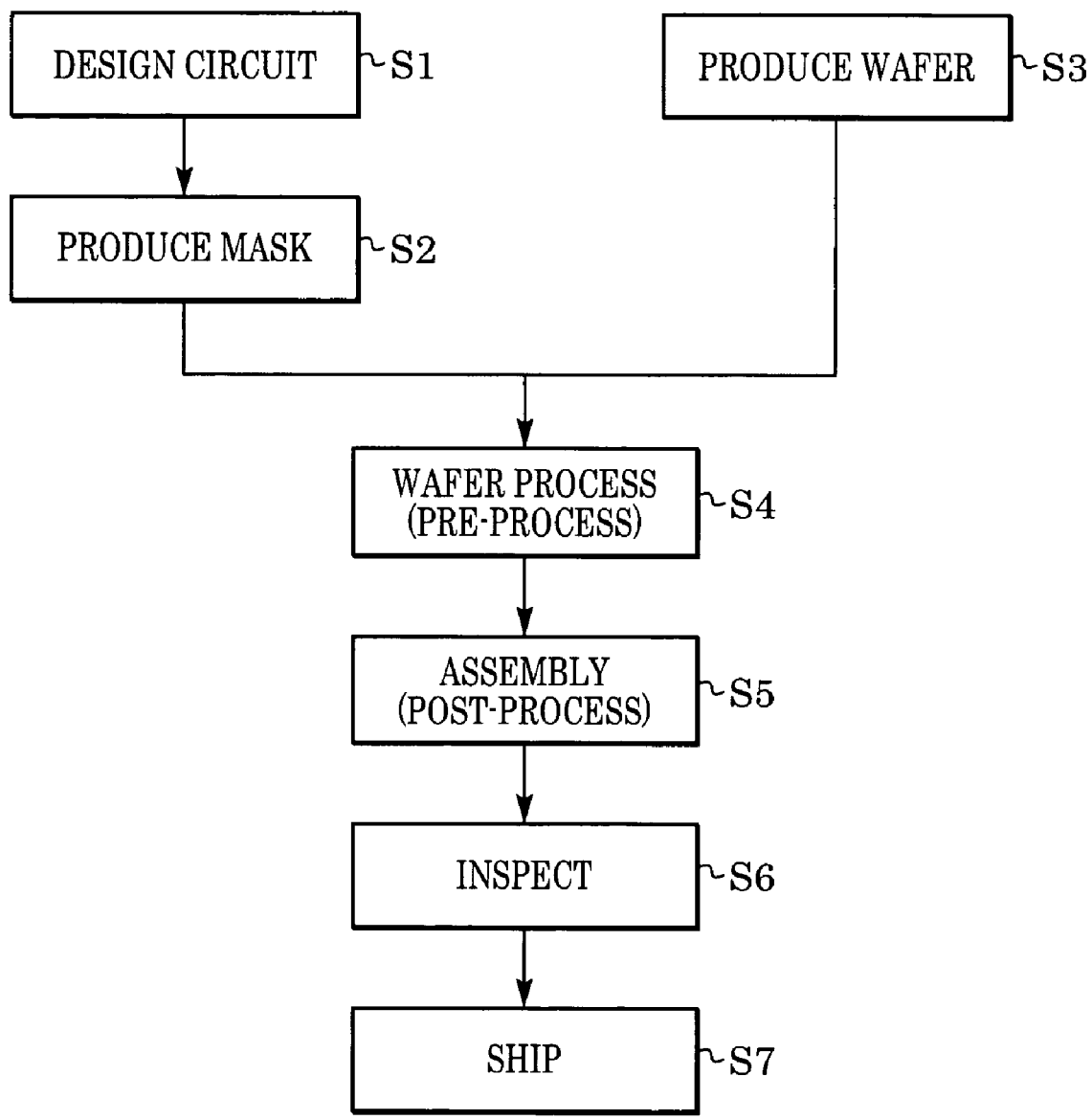
FIG. 18 illustrates a method for producing a device.

A description of a process for producing a semiconductor device using the exposure apparatus will now be given. FIG. 18 is a flowchart showing the overall process for producing the semiconductor device. In Step S1, a circuit is designed for the semiconductor device. In Step S2, a mask is produced based on the designed circuit pattern.

In Step S3, a wafer is produced using, for example, silicon. In Step S4 (called a wafer process or a pre-processing step), the mask and the wafer are used to form the actual circuit on the wafer with the exposure apparatus using lithography techniques. Then, in the following step, Step S5 (called an assembly step or a post-processing step), the wafer with the circuit is formed into a semiconductor chip, wherein assembly (dicing, bonding), packaging (of the chip), and the like, are performed. In Step S6, the semiconductor device produced in Step S5 is inspected by conducting operation confirmation and durability tests. Thereafter, in Step S7, the semiconductor device is shipped.

Step S4, or the wafer process, comprises an oxidation step, a chemical-vapor deposition (CVD) step, an electrode formation step, an ion implantation step, a resist processing step, an exposure step, a development step, an etching step, and a resist removing step. In the oxidation step, the surface of the wafer is oxidized. In the CVD step, an insulation film is deposited on the surface of the wafer. In the electrode formation step, an electrode is formed on the wafer by evaporation. In the ion implantation step, ions are implanted into the wafer. In the resist processing step, a sensitizer is applied to the wafer. In the exposure step, the circuit pattern is transferred onto the wafer with the exposure apparatus, after the resist processing step. In the development step, the exposed wafer is developed. In the etching step, portions other than where the developed resist image is formed are etched. In the resist removing step, any unnecessary resist is removed from the wafer after the etching has been performed. By repeating these steps, multiple circuit patterns are formed on the wafer.

While the present invention has been described with reference to what are at present considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2003-353746 filed Oct. 14, 2003, and Japanese Patent Application No. 2003-354613 filed Oct. 15, 2003, which are incorporated by reference herein.

What is claimed is:

1. A positioning device for positioning an object, said positioning device comprising:

a movable member which is movable in an X direction and a Y direction;

a top plate, disposed above the movable member, for mounting the object thereon;

at least four driving means, disposed between the top plate and the movable member, for driving the top plate with respect to the movable member in a Z direction;

position measuring means for measuring positions of the top plate in the X direction and the Y direction; and a controller for selecting a different group of three of said at least four driving means to drive the top plate with respect to the movable member in the Z direction on the basis of an output from the position measuring means.

2. The positioning device according to claim 1, wherein the position measuring means comprises a first mirror, a second mirror, and laser interferometers, the first mirror being disposed at one side of the top plate and having a reflecting surface extending in one direction perpendicular to the X direction, the second mirror being disposed at another side of the top plate and having a reflecting surface extending in a direction perpendicular to the Y direction, the first and second mirrors being irradiated with measurement light by the laser interferometers.

3. The positioning device according to claim 2, wherein four of said driving means are disposed at four corners of the top plate.

4. The positioning device according to claim 3, wherein the top plate has a first area and a second area, the first area having a triangular shape, the triangular shape having two sides defined by the first mirror and the second mirror, the second area being the remaining area of the plate, and wherein the controller selects the group of three driving means that is closer to the second area when an intersection of an X position measurement axis and a Y position measurement axis is situated in the first area, and selects the group of three driving means that is closer to the first area when the intersection is situated in the second area.

5. The positioning device according to claim 4, wherein the X position measurement axis is defined by the optical axis of one of the laser interferometers for performing a measurement in the X direction, and the Y position measurement axis is defined by the optical axis of one of the laser interferometers for performing a measurement in the Y direction.

6. The positioning device according to claim 5, wherein the controller has a filter for reducing a higher frequency component from an output of the position measuring means, the higher frequency component being one which causes excitation in a higher harmonic elastic mode.

7. The positioning device according to claim 5, further comprising: at least one measuring means for measuring any one of the position, the speed, and the acceleration of the top plate; and at least one driving means for applying a force to the top plate on the basis of an output from the measuring means, wherein the measuring means and the driving means are disposed on the back surface of the top plate.

8. A positioning device for positioning a movable member, said positioning device comprising:

at least one position measuring means for measuring positions of the movable member in an X direction and a Y direction;

at least four driving means for driving the movable member in a Z direction; and a controller for selecting a different group of three of said at least four driving means to drive the movable member in the Z direction on the basis of an output from the position measuring means.

9. A positioning device for positioning an object, said positioning device comprising:

a movable member which is movable in an X direction and a Y direction;

a top plate, disposed above the movable member, on which the object can be mounted;

driving means for driving the top plate with respect to the movable member;

measuring means on the top plate for measuring a position of the top plate at a node of an elastic mode; and a controller for controlling the driving means on the basis of an output from the measuring means.

10. The positioning device according to claim 9, wherein the measuring means comprises a laser interferometer disposed on the top plate.

11. The positioning device according to claim 9, wherein the measuring means comprises a linear encoder disposed on the back surface of the top plate.

12. The positioning device according to claim 11, further comprising a laser interferometer for measuring the position of the movable member in a Z direction with respect to a measurement reference, the rotational angle of the movable member around an X axis with respect to a measurement reference, and the rotational angle of the movable member around a Y axis with respect to a measurement reference, wherein the linear encoder measures the position of the top plate in the Z direction with respect to the movable member, the rotational angle of the top plate around an X axis with respect to the movable member, and the rotational angle of the top plate around a Y axis with respect to the movable member.

13. The positioning device according to claim 12, wherein the controller has a filter for reducing a higher frequency component from the position measuring means, the higher frequency component being one that causes excitation in a higher harmonic elastic mode.

14. The positioning device according to claim 12, further comprising one or more measuring means for measuring any one of the position, the speed, and the acceleration of the top plate; and driving means for applying a force to the top plate on the basis of an output from the measuring means, wherein the measuring means and the driving means are disposed on the back surface of the top plate.

15. An exposure apparatus for forming a pattern onto a substrate by illuminating the pattern, wherein the substrate is positioned with the positioning device recited in claim 1.

16. A method for producing a device, comprising: a step of using the exposure apparatus of claim 15 to form a pattern onto a substrate.

17. An exposure apparatus for forming a pattern onto a substrate by illuminating the pattern, wherein the substrate is positioned with the positioning device of claim 8.

18. A method for producing a device comprising: a step of using the exposure apparatus of claim 17 to form a pattern onto a substrate.

19. The positioning device according to claim 9, further comprising a laser interferometer for measuring the position of the movable member in a Z direction with respect to a measurement reference, the rotational angle of the movable member around an X axis with respect to a measurement reference, and the rotational angle of the movable member around a Y axis with respect to a measurement reference.

20. The positioning device according to claim 19, wherein the controller has a filter for reducing a higher frequency component from the position measuring means, the higher frequency component being one that causes excitation in a higher harmonic elastic mode.

21. The positioning device according to claim 10, wherein the laser interferometer measures the position of the top plate in the Z direction with respect to the movable member, the rotational angle of the top plate around an X axis with respect to the movable member, and the rotational angle of the top plate around a Y axis with respect to the movable member.

22. The positioning device according to claim 21, wherein the controller has a filter for reducing a higher frequency component from the position measuring means, the higher frequency component being one that causes excitation in a higher harmonic elastic mode.

23. The positioning device according to claim 19, further comprising one or more measuring means for measuring any one of the position, the speed, and the acceleration of the top plate; and driving means for applying a force to the top plate on the basis of an output from the measuring means, wherein the measuring means and the driving means are disposed on the back surface of the top plate.

24. The positioning device according to claim 21, wherein the controller has a filter for reducing a higher frequency component from the position measuring means, the higher frequency component being one that causes excitation in a higher harmonic elastic mode.

25. The positioning device according to claim 12, wherein said measurement means measures the position of the top plate in a Z direction, a rotational angle around the X axis, and a rotational angle around the Y axis.

26. The positioning device according to claim 9, wherein said top plate is in a shape of a rectangle and said measurement means measures the position of said top plate at the center position or near the top plate.

27. A positioning device for positioning an object, said positioning device comprising:
- a movable member which is movable in an X direction and a Y direction;
- a top plate, disposed above the movable member, for mounting the object thereon;
- at least four drives, disposed between the top plate and the movable member, for driving the top plate with respect to the movable member in a Z direction; and
- a controller for selecting a different group of three of said at least four drives to drive the top plate with respect to the movable member in the Z direction on the basis of the position of the top plate.

* * * * *

UNITED STATES PATENT AND TRADEMARK OFFICE
CERTIFICATE OF CORRECTION

| | |
|---|---|
| PATENT NO. | : 7,133,115 B2 |
| APPLICATION NO. | : 10/950564 |
| DATED | : November 7, 2006 |
| INVENTOR(S) | : Ryo Nawata |

It is certified that error appears in the above-identified patent and that said Letters Patent is hereby corrected as shown below:

COLUMN 7:
    Line 28, "1101$a$" should read -- 1011$a$ --.
    Line 35, "1101$d$." should read -- 1010$d$. --.
    Line 52, "1011$a$" should read -- 1010$a$ --.
    Line 53, "1101$d$," should read -- 1010$d$, --.

COLUMN 11:
    Line 35, "1101$a$" should read -- 1011$a$ --.
    Line 37, "1101$d$." should read -- 1010$d$. --.

COLUMN 16:
    Line 4, "rectange" should read -- rectangle --.

Signed and Sealed this

Fourteenth Day of August, 2007

JON W. DUDAS
*Director of the United States Patent and Trademark Office*